(12) United States Patent
Lin et al.

(10) Patent No.: US 8,835,882 B2
(45) Date of Patent: Sep. 16, 2014

(54) REAL TIME MONITORING ION BEAM

(75) Inventors: Wei-Cheng Lin, Hsinchu (TW); Zhimin Wan, Sunnyvale, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 0 days.

(21) Appl. No.: 13/608,941

(22) Filed: Sep. 10, 2012

(65) Prior Publication Data
US 2013/0001433 A1    Jan. 3, 2013

Related U.S. Application Data

(63) Continuation-in-part of application No. 12/370,571, filed on Feb. 12, 2009, now abandoned.

(51) Int. Cl.
| | |
|---|---|
| *G21K 5/04* | (2006.01) |
| *H01J 37/304* | (2006.01) |
| *H01J 37/244* | (2006.01) |
| *H01J 37/317* | (2006.01) |

(52) U.S. Cl.
CPC ... *H01J 37/3171* (2013.01); *H01J 2237/24507* (2013.01); *H01J 2237/30472* (2013.01); *H01J 37/304* (2013.01); *H01J 37/244* (2013.01); *H01J 2237/24528* (2013.01)
USPC .................. 250/492.3; 250/492.1; 250/396 R; 250/397

(58) Field of Classification Search
CPC ........... H01J 37/04; H01J 37/05; H01J 37/10; H01J 37/1472; H01J 37/1477; G21K 5/00; G21K 5/04
USPC ............... 250/396 R, 397, 398, 492.1, 492.2, 250/492.22, 492.23, 492.3
See application file for complete search history.

(56) References Cited

U.S. PATENT DOCUMENTS

| | | | |
|---|---|---|---|
| 6,403,972 B1 | 6/2002 | Cucchetti et al. | |
| 6,670,624 B1 * | 12/2003 | Adams et al. ............ | 250/492.21 |
| 6,815,696 B2 | 11/2004 | Richards et al. | |
| 2003/0222227 A1 * | 12/2003 | Richards et al. ......... | 250/492.21 |
| 2010/0001204 A1 | 1/2010 | White | |

* cited by examiner

*Primary Examiner* — Nicole Ippolito
(74) *Attorney, Agent, or Firm* — Stout, Uxa & Buyan, LLP; Donald E. Stout

(57) ABSTRACT

The invention provides a method to real time monitor the ion beam. Initially, turn on an ion implanter which has a wafer holder, a Faraday cup and a measurement device positioned close to a special portion of a pre-determined ion beam path of the ion beam, wherein the Faraday cup is positioned downstream the wafer holder and the measurement device is positioned upstream the wafer holder. Then, measure a first ion beam current received by the Faraday cup and a second ion beam current received by the measurement device. By continuously measuring the first and second ion beam current, the ion beam is real-time monitored even the Faraday cup is at least partially blocked during the period of moving the wafer holder across the ion beam. Accordingly, the on-going implantation process and the operation of the implanter can be adjusted.

29 Claims, 12 Drawing Sheets

Turn on an ion implanter which has a wafer holder for moving a wafer, a Faraday cup for measuring an ion beam and a measurement device positioned close to a special portion of a pre-determined ion beam path of the ion beam, wherein the Faraday cup is positioned downstream the wafer holder and the measurement device is positioned upstream the wafer holder
301

Measure a first ion beam current received by the Faraday cup and a second ion beam current received by the measurement device
302

FIG.3A

Turn on an ion implanter which has a wafer holder for moving a wafer and a measurement device positioned close to a special portion of a pre-determined ion beam path of the ion beam, wherein the measurement device is positioned upstream the wafer holder and surrounds at least one of the special portion and a straight line extending from the special position, wherein the measurement device has one or more conductive structures that each is positioned close to the special portion but separated from both the special portion and other conductive structures, and wherein different said conductive structures are electrically connected to different current meters
303

Measure an ion beam current received by the measurement device
304

FIG.3B

Providing an ion beam that passes along a desired trajectory from a beam existence of an analyzer magnet of an ion implanter to a wafer in an ideal condition
501

Measure a current appears on at least one conductive structure located close to the beam existence, wherein each conductive structure is electrically insulated from other conductive structures and other portions of the analyzer magnet
502

FIG.5

REAL TIME MONITORING ION BEAM

CROSS-REFERENCE TO RELATED APPLICATIONS

This application is a continuation-in-part of U.S. application Ser. No. 12/370,571, filed on Feb. 12, 2009, the entire contents of which are hereby incorporated by reference.

BACKGROUND OF THE INVENTION

1. Field of the Invention

The present invention generally relates to the method and the ion implanter of real time monitoring ion beam, and more particularly, is focused on real-time monitoring the ion beam when the Faraday cup is at least partially blocked.

2. Description of Related Art

Ion implantation is widely used in the semiconductor manufacture, for example, to implant wafers with desired. ions of desired energy. Ion implantation usually requires a uniform distribution and consistent amount of ions beam to be implanted into a wafer.

FIG. 1 is a diagram for a conventional ion implanter 100. The conventional ion implanter 100 could implant specific ions with desired energy on a wafer 20. The ion implanter 100 has an ion source 110 capable of generating an ion beam 10. The ion beam 10 generated from the ion source 110 is analyzed by an analyzer magnet 120 and travels along a desired trajectory. The analyzer magnet 120 includes a beam exist 121, a beam entrance 122 and a magnet field. space 123. Herein, as well-known knowledge, the magnet filed in the magnet field space 123 is adjustable. Hence, ions with undesired mass and/or undesired energy strike on the shell of the analyzer magnet 120, and then are removed from the ion beam 10. After that, the ion beam 10 passes through the beam exist 121 and could be projected on the wafer holder by the wafer holder 20. The conventional ion implanter 100 further includes one or more acceleration/deceleration electrodes 131, one or more magnets 132 and plasma flow gun 133. The acceleration/deceleration electrodes 131 apply at least one electric field on the ion beam 10 so that the energy of the ion beam 10 is adjusted, and the magnets 132 separately apply at least one magnetic field on the ion beam 10 so that the shape of the ion beam 10 is adjusted. The plasma flow gun 133 emits plasma or electrons crossing the ion beam causing the ions have electric neutrality since the ions are positive chargers. In addition, FIG. 1 is only a schematic diagram, which does not show the real variations of the beam shape, beam size, beam path and so on, which also does not show all potential elements inside the ion implanter 100.

As mentioned above, the conventional ion implanter measures and receives the ion beam by the Faraday cup 127 positioned downstream the wafer 20. Since the wafer holder 20 moves relatively to the ion beam such that the ion beam can implants into the whole wafer 20, during some portions of the process, the Faraday cup 127 may be at least partially blocked by the wafer holder 20 (or by the held wafer or other relative hardware) and can not receive and measure the ion beam.

If the current of the ion beam or the operation of the ion implanter is stable, the problem mentioned above no longer exists or could be ignored. However, when the current of the ion beam or the operation of the ion. implanter is unstable, then the variation of the implantation of the wafer 20 resulting from the relative movement between the wafer and the ion beam can not be ignored. In other words, if the ion beam path occurs a deflection, which can not be monitored before or during the ion implantation process. Therefore, the difference between the real implantation and the predetermined implantation can not be monitored effectively.

Particularly, when the precision requirement of the ion implanter is higher or the scale of devices formed on the wafer becomes smaller, for example the newly present device with a critical dimension about 22~28 nm, the problem mentioned above will be more serious.

For the disadvantage mentioned above, there is a need to propose a novel and useful approach for monitoring the real-time condition of the ion beam during the ion implantation process.

SUMMARY OF THE INVENTION

The present invention provides a new approach for monitoring the real-time condition of the ion beam, even for steering the ion beam and adjusting the implantation on the implanted wafer by measuring the offset beam current hit on the measurement device close to the pre-determined ion beam path when the Faraday cup is at least partially blocked from the ion beam.

One embodiment is a method for monitoring ion beam. The method comprises the following steps: Initially, turn on an ion implanter which has a wafer holder for moving a wafer, a Faraday cup for measuring an ion beam and a measurement device positioned close to a special portion of a pre-determined. ion beam path of the ion beam, wherein the Faraday cup is positioned downstream the wafer holder and the measurement device is positioned upstream the wafer holder. Next, measure a first ion beam current received by the Faraday cup and a second ion beam current received by the measurement device.

Another embodiment is a method for monitoring ion beam. The method comprises the following steps: Initially, turn on an ion implanter having a measurement device positioned close to a special portion of a pre-determined ion beam path of an ion beam. Then, measure a measured ion beam current received by the measurement device. The measurement device is positioned downstream an ion source and upstream a wafer holder, and the measurement device has one or more conductive structures. Each conductive structure is close to the special portion but separated from both the special portion and other conductive structures, and different conductive structures are electrically connected to different current meters. Moreover, the measurement device surrounds at least one of the following: the special portion and a straight line extending from said special position.

Another embodiment is an ion implanter comprises an ion source for providing an ion beam, a wafer holder for holding a wafer to be implanted by said ion beam, a Faraday cup for measuring said ion beam when said ion beam is not implanted into said wafer, and a measurement device which is positioned close to a special portion of a pre-determined ion beam path of said ion beam and is positioned downstream said wafer holder. The Faraday cup is positioned downstream the wafer holder and the measurement device is positioned upstream the wafer holder, and the pre-determined ion beam path is positioned between the ion source and the wafer holder. Also, the special portion is chosen from a group consisting of the following: the entrance of a mass analyzer, the exit of a mass analyzer, the terminal of a set of acceleration/ deceleration electrode, the terminal of a set of deformation magnets, the terminal of a scanner for scanning said ion beam, the terminal of a plasma flow gun, and a position where said pre-determined ion beam path is bended.

Another embodiment is an ion implanter. The ion implanter comprises an ion source, an analyzer magnet and a current meter. The analyzer magnet has a shell enclosing a magnetic field space, and both a beam entrance and a beam exist allowing the ion beam to pass through. The analyzer magnet further has at least one conductive structure located close to the boundary of the beam exist and electrically insulated from the shell. Further, each conductive structure is electrically coupled with a current meter for real-time monitoring a current produced by a collision between the conductive structure(s) and a deflected ion beam. Hence, the ion beam steering control could be achieved by comparing the offset ion beam current hit on the analyzer magnet.

Another embodiment is a method for monitoring the real-time real condition of the ion beam. The method comprises the following steps: First, provide an ion beam that passes through a beam exist of an analyzer magnet; Second, measure a current appears on at least one conductive structure located close to the boundary of the beam exist, wherein each conductive structure is electrically insulated from other portions of the analyzer magnet (includes other conductive structure(s)). Then, by real-time analyzing the current, the deflection of the ion beam is real-time monitored and then the implanter could be adjusted to adjust the deflection of the ion beam.

BRIEF DESCRIPTION OF THE DRAWINGS

FIG. 3A and FIG. 3B show the flowcharts of two methods in accordance with two embodiments of the present invention;

FIG. 5 shows the flowchart of a method in accordance with another embodiment of the present invention.

DETAILED DESCRIPTION OF THE INVENTION

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

As discussed above, the ion beam can not be monitored when the Faraday cup is at least partially blocked by the wafer, the water holder or other relative hardware. Moreover, even a profiler is used to analyze the ion beam, as well-known by the skilled one in the art, the profiler is also position downstream or about the position of the wafer holder. Hence, both the conventional Faraday cup and the conventional profiler can not real-time monitor the ion beam, because they can not continuously monitor the ion beam during whole the implantation period.

Figure 1:
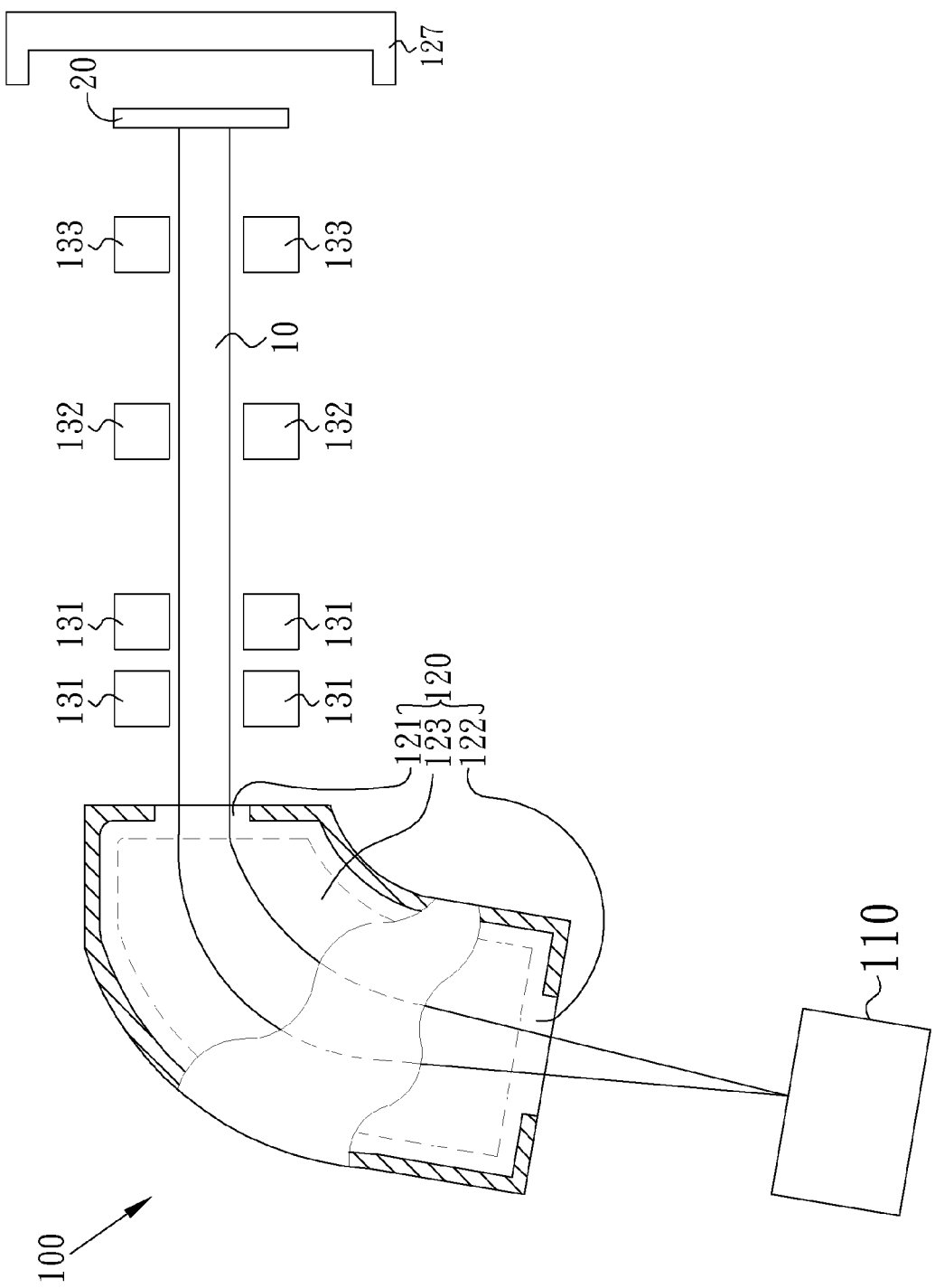
FIG. 1 is a diagram for a conventional ion implanter.
Figure 2A:
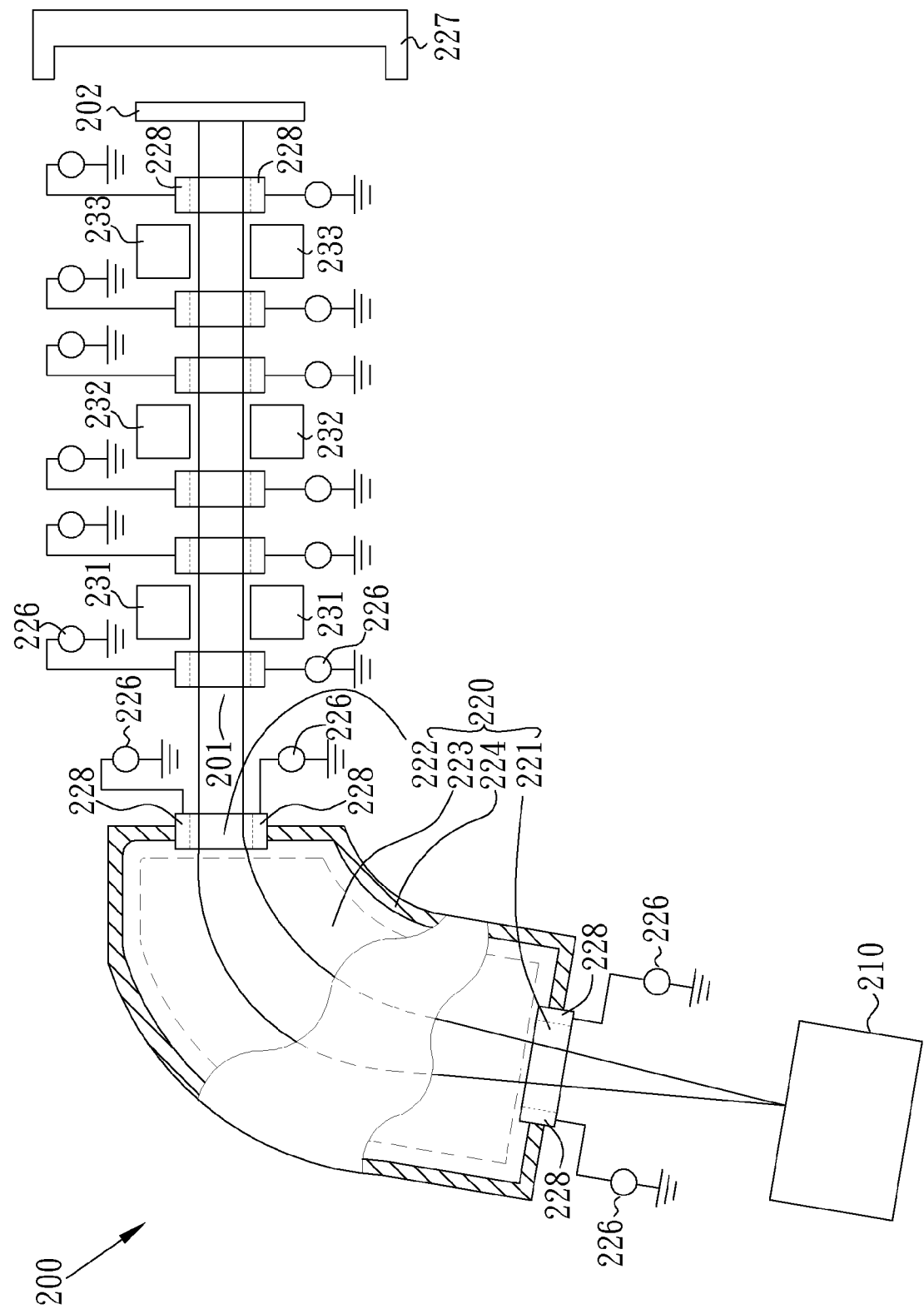
FIG. 2A to FIG. 2C show the sectional views of an ion implanter in accordance with some embodiments of the present invention.

FIG. 2A shows the sectional view of an ion implanter 200 in accordance one embodiment of the present invention. The implanter 200 includes an ion source 210 and an analyzer magnet 220. The ion beam 201 is generated by the ion source 210 and can be filtered by the analyzer magnet 220. The ion beam 201 passes through the beam entrance 221 into the analyzer magnet 220, and then passes through the beam exist 222 toward the wafer holder 202 which holds the wafer to be implanted. Usually, some elements are positioned between the analyzer magnet 220 and the wafer holder 202 for flexibly tuning the ion beam 201 so that different wafers can be properly implanted with individual implantations parameters' values. For example, some acceleration/deceleration electrode 231 are used to increase or decrease the ion beam energy of the ion beam 201, some magnets 232 are used to adjust the size and the contour of the ion beam 201, and the plasma flow gun 233 are used to neutralize the ion beam 201 right before the wafer being implanted. The Faraday cup 227 can measure the ion beam 201 to be implanted into the wafer which usually is moved in respect to the ion beam 201 by the wafer holder 202. Particularly, one or more measurement devices 228 are positioned between the ion source 210 and the Faraday cup 227. Herein, each measurement device 228 is positioned close to a special portion of a pre-determined ion beam path and upstream the wafer holder 201 (i.e., upstream the held wafer). Also, each measurement device 228 is electrically connected to a current meter 226 capable of measuring any current appeared on the measurement device 228. Note the FIG. 2A only shows the concept of the proposed ion implanter, the number, the position and other details of the measurement devices 228 are not limited by FIG. 2A, also the details of other elements of the ion implanted are not limited by FIG. 2A.

Significantly, the measurement device 228 and the Faraday cup 227 may measure the ion beam 201 from different approaches. The Faraday cup 227 positioned downstream the wafer holder 202 (i.e., downstream the wafer holder which is not illustrated) can receive whole the ion beam 201 and measure the ion beam current of whole the ion beam 201. In contrast, the measurement device 228 is positioned upstream the wafer holder 202 and along the pre-determined ion beam path between the ion source 210 and the wafer holder 202. Hence, when the practical ion beam path is different than the pre-determined ion beam path, at least a portion of the ion beam 201 may be received and measured by the measurement device 228. Moreover, because the measurement device 228 is positioned upstream the wafer holder 202, the measurement device 228 may monitor the ion beam 201 no matter whether the Faraday cup 227 is at least partially blocked by the wafer holder 202. In this way, the measurement device 228 may monitor the variation of the ion beam 201 during the period that the Faraday cup 227 can not receive whole the ion beam 201, i.e., the measurement device 228 provides an approach to real-time monitor the ion beam.

Further, the difference(s) between the practical ion beam path and the pre-determined ion beam path usually is induced by two problems: (1) the practical operation of any element of the ion implanter may be different than the pre-determined operation because the practical world has noise, vibration, tolerance and so on, and then the ion implanter may can not tune the pre-determined ion beam path well. (2) The practical operation of any element of the ion implanted may be not stable enough, so that the practical ion beam path may be varied during the implantation period. Clearly, the differences are more serious on some portions of the pre-determined ion beam path where the ion beam path is bended or the ion beam is deformed (or viewed as shaped), because the motions of the charged ions in the ion beam are significantly changed hereto.

Figure 2B:
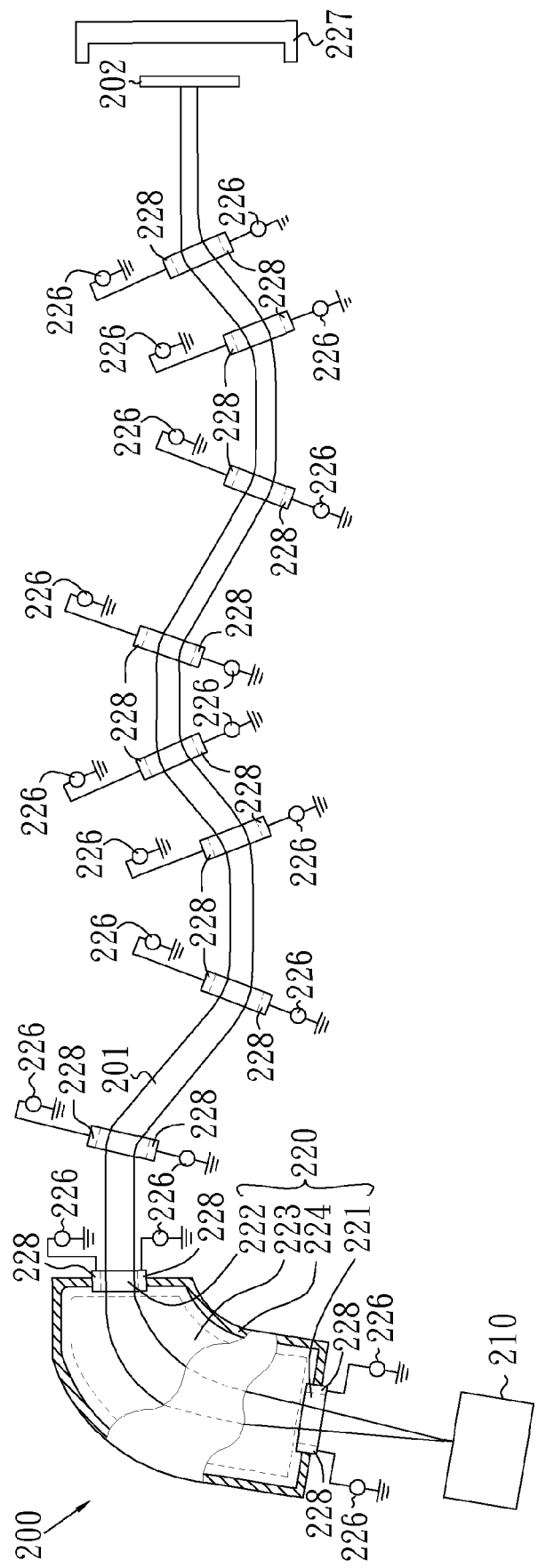

FIG. 2B briefly illustrates a special condition that the measurement device 228 and the current meter 226 are positioned, on all potential positions where the per-determined ion beam is bended. Note that many elements positioned between the mass analyzers 220 and the wafer holder 202 are omitted for simplifying FIG. 2B. However, the invention does only require the measurement device 228 is closed to a special portion of the pre-determined ion beam path for real-time monitoring the variation around this special portion, but does not limit where the special portion is. For examples only, the measurement device 228 may be positioned, at the entrance of the mass analyzer 220, the exit of the mass analyzer 220, the terminal of acceleration/deceleration electrode 231, the terminal of deformation magnets 232, the terminal of the plasma flow gun 233, the terminal of a scanner for scanning said ion beam 201, the internal space between neighboring acceleration/deceleration electrode 231, the internal space between neighboring deformation magnets 232, and a position where the pre-determined ion beam path is bended.

Figure 2C:
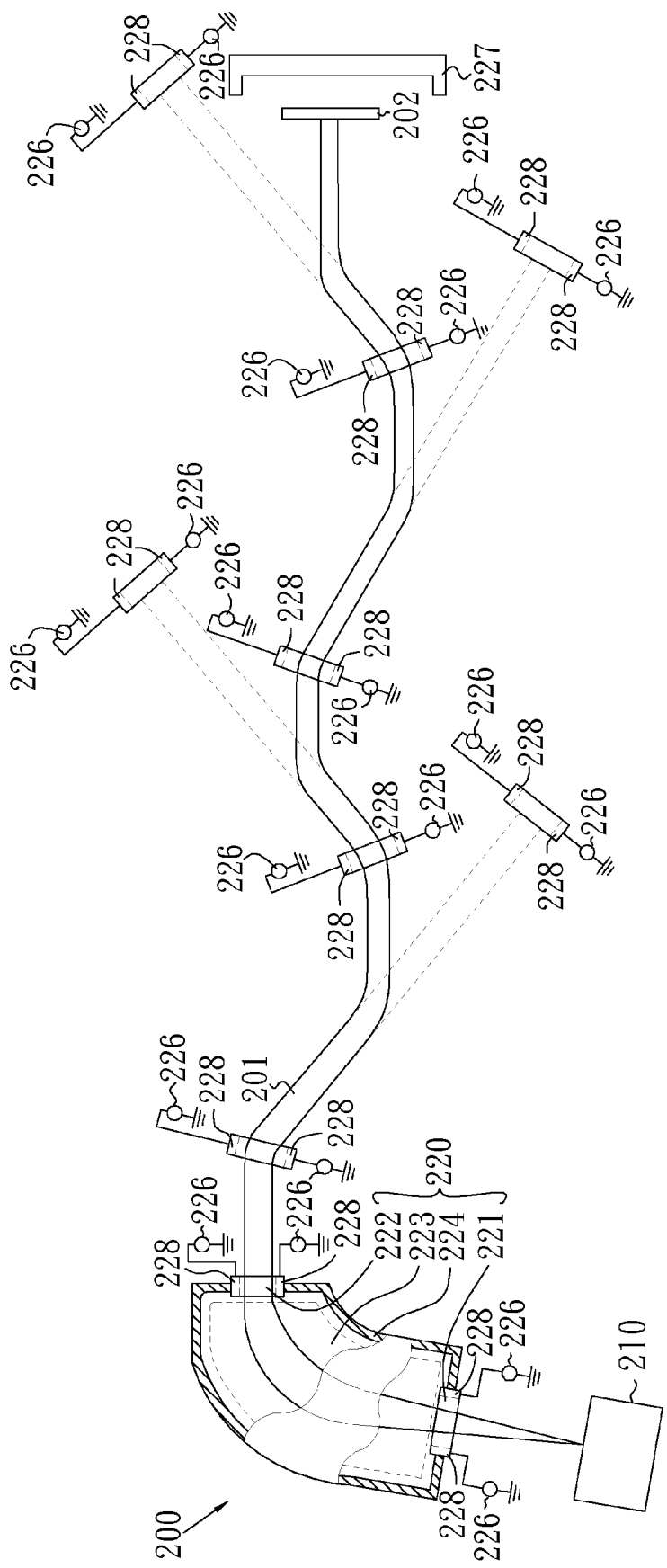

FIG. 2C briefly illustrates some potential positions of both the measurement device 228 and the current meter 226. They may be positioned closed to a special portion of the pre-determined ion beam path where the pre-determined ion beam path is bended, also may be positioned on a portion of a straight line extending from the special portion of the pre-determined ion beam path. Note that many elements positioned between the mass analyzers 220 and the wafer holder 202 are omitted for simplifying FIG. 2C. In general, the measurement device 228 are positioned closed, to the pre-determined ion beam path for effectively monitor the ion beam. However, sometimes the element(s) are configured strictly and then there is no enough space to locate the measurement device 228. In this situation, it may be useful to position the measurement device 228 on the straight line extending from the special portion of the pre-determined ion beam path.

Further, to more precisely and flexibly real-time monitor the ion beam 201, the configuration of the measurement device 228 has many different potential configurations. For example, the ion implanter 200 may have one or more measurement devices 228 for monitoring one or more portions of the pre-determined ion beam path. For example, the measurement 228 may be fixed inside the ion implanter 200, but also may be movable inside the ion implanter 200. The benefit of the latter is that one measurement device 228 may be flexibly moved to monitor different portions of the pre-determined ion beam path at different times.

Figure 2D:
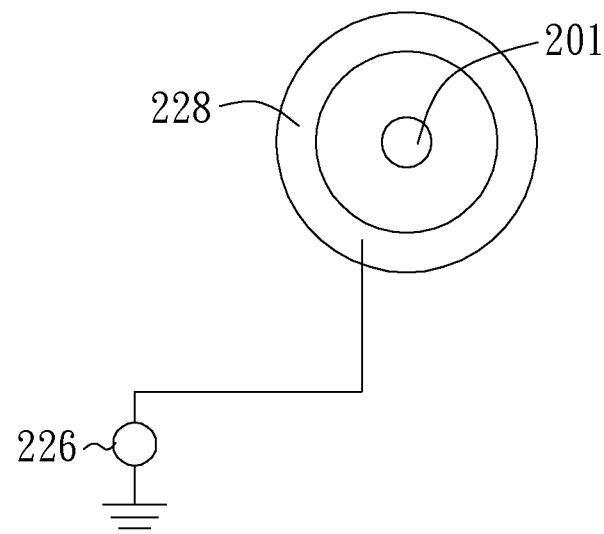
FIG. 2D to FIG. 2F show the cross-sectional view of the measurement device in accordance with some embodiments of the present invention.

In one example as shown on FIG. 2D, the measurement device 228 is shaped as a single, one and only one, loop surrounding a special portion of a pre-determined ion beam path of the ion beam 201, herein FIG. 2D is viewed from a cross-sectional plane vertical to the ion beam 201. The measurement device 228 is made of electric conductive material, and is electrically connected to the current meter 226. In this way, when the ion beam 201 is deflected around this special portion, the ion beam 201 may collide the measurement device 228 so that a current is detected by the current meter 226. Reasonably, when the radial size of the measurement device 228 is clearly smaller than the cross-sectional area of the ion beam 201, the measurement device 228 only can be used detect whether the ion beam 201 is deflected by whether the current appeared on the measurement device 228 is zero or non-zero. In contrast, when the radial size of the measurement device 228 is briefly equal to or even larger than the cross-sectional area of the ion beam 201, the measurement device even can be used detect the degree of the deflection of the ion beam 201 by comparing the current appeared on the measurement device 228 with the current received by the Faraday cup 227.

Figure 2E:
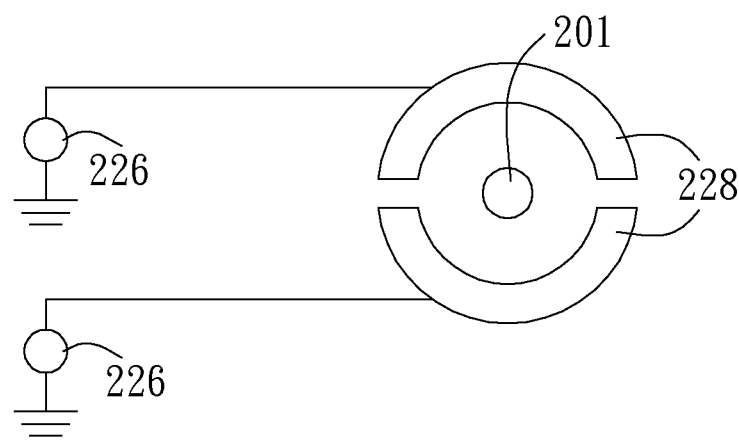
Figure 2F:
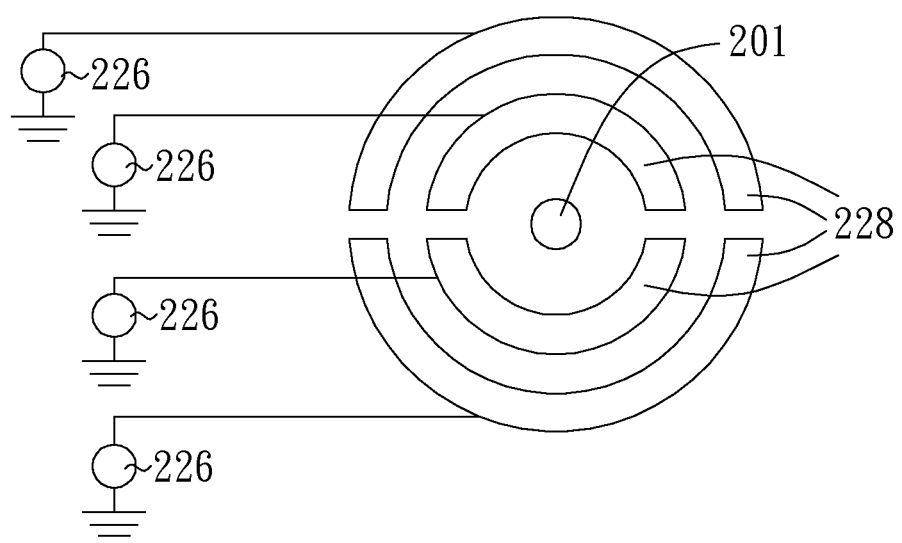

Furthermore, to more flexible monitor the deflection of the ion beam, as shown on FIG. 2E and FIG. 2F, the measurement device 228 also may be shaped as two opposite circular arcs surrounding the ion beam 201, or be shaped as some separated circular arcs surrounding the ion beam 201. In this way, by comparing different currents appeared on different circular arcs, both the deflection direction and the direction angle of the ion beam 201 may be decided because the relative geometric relation between these circular arcs and the pre-determined ion beam path of the ion beam 201 is controllable.

Note that the shape/size of the measurement device 228, even the shape/size of the conductive structure 225, is not particularly limited. Although the illustrated examples of the measurement device 228 has a "ring-type" for emphasizing the characteristic of surrounding the pre-determined ion beam path of the ion beam 201, indeed, the measurement device 228 can be shaped as a combination of some straight conductive structures or a combination of one or more flexible shaped conductive structures. Also, the size and the area, of the measurement device 28 (also the conductive structure(s) used to form the measurement device 28) are not limited. Note that each conductive structure 225 as a part of the measurement device 228 also has similar flexibility on the shape, size and so on. For example, the measurement device 228 may have three or four conductive structure 225 that each is shaped as the straight rod, so that the measurement device 228 may be shaped a rectangle of roundness.

In short, the measurement device 228 has one or more conductive structures that each surrounds a special portion of the pre-determined ion beam path but is separated from the special portion of other conductive structures. Herein, different conductive structures are electrically connected to different current meters. Accordingly, not only whether the ion beam is deflected away the pre-determined ion beam path may be detected, but also the deflection direction and the deflection angle of the deflected ion beam may be detected.

Reasonably, as discussed above, when the details of the practical ion beam, such as the deflection direction and the degree of the deflection angle, are measured, the operation of the ion implanted and the relative movement between the ion beam and the wafer holder can be adjusted accordingly to improve the practical implantation result over the wafer held by the wafer holder.

Accordingly, the present invention provides an exemplary method for real-time monitoring the ion beam, particularly to monitor the ion beam when the Faraday cup is at least partially blocked. As shown on FIG. 3A, the method comprises the following steps. Initially, in step 301, turn on an ion implanter which has a wafer holder for moving a wafer, a Faraday cup for measuring an ion beam and a measurement device positioned close to a special portion of a pre-determined ion beam path of the ion beam, wherein the Faraday cup is positioned downstream the wafer holder and the measurement device is positioned upstream the wafer holder. Then, in step 302, measure a first ion beam current received, by the Faraday cup and a second ion beam current received by the measurement device.

Reasonably, the first current received by the Faraday cup is continuously and gradually varied during a period that the wafer and the ion beam are moved through each other. Thus, if an abnormal variation of the first ion beam current is detected, it can be decided that the ion beam meets an abnormal situation. However, during this period, the Faraday cup can not receive whole of the ion beam, even can not receive any ion beam while the Faraday cup being totally blocked by the wafer. Therefore, some abnormal phenomena of the ion beam can not detected by the Faraday cup.

Nevertheless, the measurement device always can receive and measure the second ion beam current no matter whether the Faraday cup is blocked or not. In this way, the variation of the ion beam can be real-time monitored by the measurement device. In short, when the practical ion beam path, or the practical ion beam shape/contour, is varied during the period that the wafer and the ion beam are moved through each other, the second ion beam current appeared on the measurement device will be varied correspondingly except the variation is too small to be detect by the measurement device. Thereafter, by continuously analyzing the second ion beam current, the variation of the ion beam, or viewed as the variation of the ion implanter, can be real-time monitored.

As discussed above, the detailed configuration of the measurement device is flexible, and then both the deflection direction and the degree of the deflection angle are measureable. In other words, not only the existence of an abnormal phenomena of the ion beam, or the phenomena of the ion implanter, may be real-time monitored, but also the details of the abnormal phenomena may be real-time monitored.

Note that the operation of the measurement device is independent on the operation of the Faraday cup, because one is positioned upstream the wafer holder and another is positioned downstream the wafer holder. Accordingly, the present invention provides another exemplary method for real-time monitoring the ion beam. As shown on FIG. 3B, the method comprises the following steps. Initially, in step 303, turn on an ion implanter which has a wafer holder for moving a wafer and a measurement device positioned close to a special portion of a pre-determined ion beam path of the ion beam, wherein the measurement device is positioned upstream the wafer holder and surrounds at least one of the special portion and a straight line extending from the special position, wherein the measurement device has one or more conductive structures that each is positioned close to the special portion but separated from both the special portion and other conductive structures, and wherein different said conductive structures are electrically connected to different current meters. Then, in step 304, measure an ion beam current received, by the measurement device.

On the basis of the measured first ion beam current and the second ion beam which are measured by the Faraday cup and the measurement devices respectively, the invention may further perform at least one of some potential application. For example, sending a warning signal to emphasize the existence of an abnormal situation, tuning the practical ion beam path, tuning the operation of the ion implanter, turning the implantation of the ion beam over the implanted wafer, and so on.

One potential application is sending a warning signal when the first ion beam current received by the Faraday cup and/or the second ion beam current received by the measurement device has an abnormal variation, or is varied or non-zero. Herein, the warning signal can be sent when the abnormal variation is appeared and the Faraday cup is not totally blocked from the ion beam, when the second ion beam current is not zero or is varied when the Faraday cup is totally blocked, from the ion beam. For example, if the second ion beam current measured by the measurement device is X when the Faraday cup is totally not blocked. Then, while the measured second ion beam current being not X during the period that the Faraday cup is at least partially blocked, it can be decided that an abnormal situation is happened and then a warning signal is sent to emphasize it.

Another potential application is adjusting the operation of the ion implanter according to the measured first ion beam current and/or the measured second ion beam current, especially according to the variation of the measured first ion beam current and/or the measured second ion beam current. Hence, at least one of the following may be adjusted: the practical ion beam path, the ion beam energy of the ion beam, the net ion beam current of the ion beam, the distribution of the ion beam, and the relative movement between the wafer and the ion beam. For example, when the second ion beam current is not zero which indicates the practical ion beam path is different than the pre-determined ion beam path, the implantation over the wafer may adjusted according to the differences between the practical one and the pre-determined one. Also, the ion implanter 200 may be adjusted to amend the practical ion beam path so that the difference between the practical one the pre-determined one is zero or at least may be omitted. In other words, the practical ion beam path may be adjusted to be equal to the pre-determined ion beam path according to the measured first and/or second ion beam current. Besides, when the ion beam is not delivered along the pre-determined ion beam path, it is possible to adjust the wafer holder so that the practical implant angle between the ion beam and the wafer 202 is still equal to a pre-determined implant angle.

In addition, to more flexibly monitor the ion beam, the invention also can move the measurement device along the pre-determined ion beam path. In this way, different portions of the pre-determined ion beam path may be flexibly monitored by simply mechanism. For example, different ion implantations usually required different kinds of ion beams, and then the operations of the ion implanter usually are different for providing different required ion beams. For example, sometimes the voltage difference between neighboring acceleration/deceleration electrodes is larger but sometimes the magnitude of the magnetic field of the magnets used to shape/deform the ion beam is larger. Hence, same measurement device may be moved between different elements of the ion implanter to flexibly measure where the probability of beam deflection is higher.

Of course, to flexibly and precisely monitor the ion beam, the invention also may controlled adjust the relative geometric relation between the measurement device and the special portion. Thus, the deflection, direction and the degree of the deflection angle may be more effectively real-time monitored.

Further, as discussed above, each measurement device may be formed by one or more conductive structures that each surrounds a special portion of the ion beam and electrically connected to a current meter but is separated from the special portion and other conductive structure(s). Therefore, by properly adjusting the shape of the conductive structure(s) 225 and/or the location/number of the conductive structure(s) 225, the ion beam may be continuously and precisely monitored so that the real-time message(s) of the ion beam may be acquired. Note that the more conductive structures, the higher precision and the higher flexibility of the measured second ion beam current.

Figure 4A:
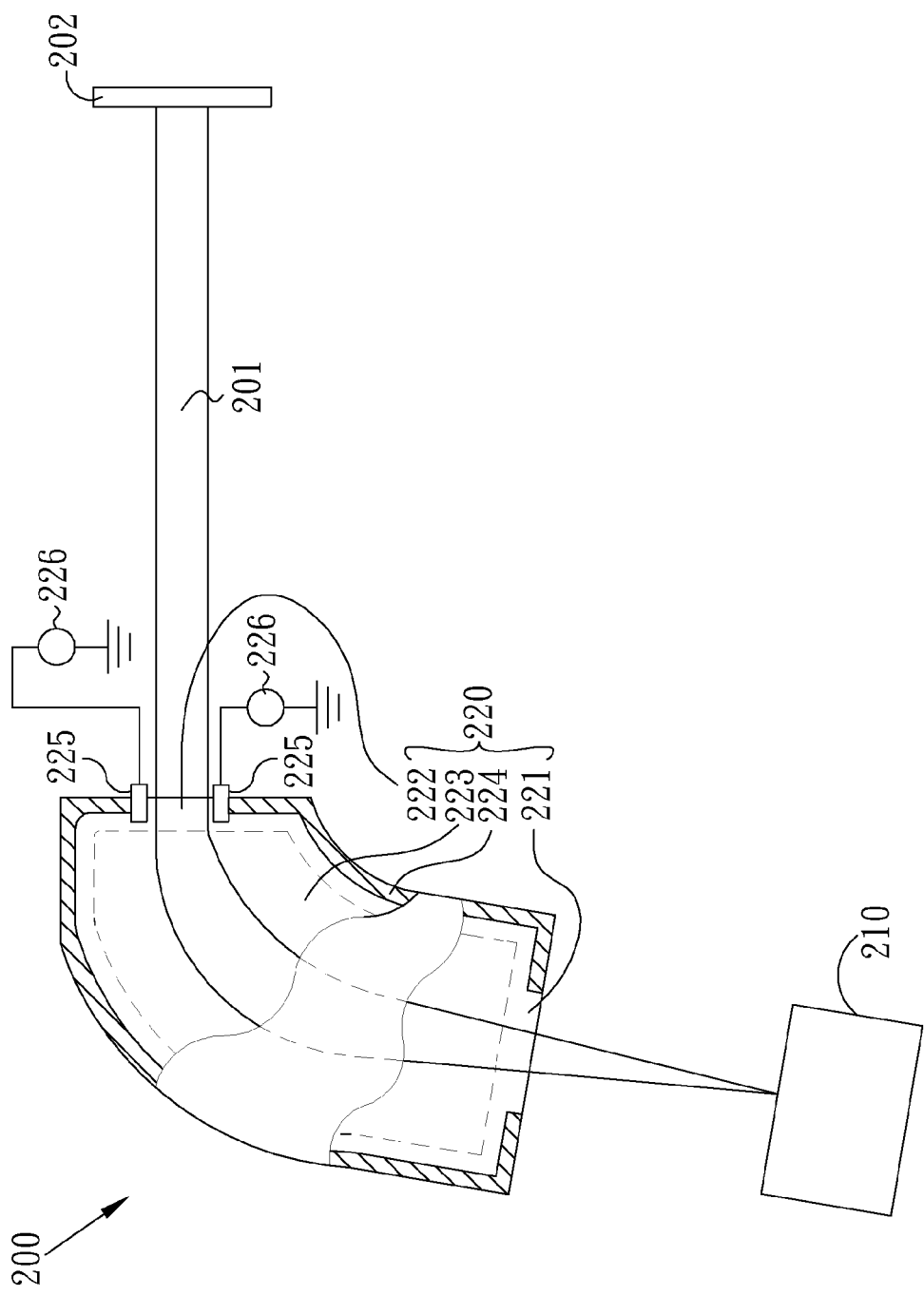
FIG. 4A to FIG. 4D show the front view in accordance with some embodiments of the present invention.

One more embodiment is related to a special configuration of the measurement device which is formed by at least one conductive structure located close to the boundary of the exit of the analyzer magnet 220, as shown in FIG. 4A. Herein, each conductive structure 225 is electrically insulated from the shell 224 of the analyzer magnet 220 and other conductive structure(s) 225 by an electrical insulator (not shown to simplify the figures). Each conductive structure 225 is electrically coupled with a current meter 226, such as current meter, such that any current appeared on any conductive structure 225 is real-time monitored.

In general, the ion beam 201 is firstly measured by using the Faraday cup and/or analyzing the implanted result. Hence, an original ion beam current to is measured. Then, during ion implantation, when the conductive structure(s) 225 catches a deflected current $I_D$ induced by deflected ion beam 201, it is clearly that the real implanted ion beam current on the wafer 202 is changed from $I_O$ to a difference between $I_O$ and $I_D$. Hence, owing to the current meter(s) electrically coupled with the conductive structure(s) 225 could continuously display the amount of the $I_D$, the real implanted ion beam current, $I_O$-$I_D$, could be real time monitored. Accordingly, the implantation process could be adjusted. For example, the ion source 210 could be adjusted to adjust the amount of the ion beam 201 just generated, the scan path of the ion beam 201 can be adjusted to adjust the implanted result, and/or the implantation period can be extended to balance the decrement of the real implanted ion beam current.

Furthermore, the deflected ion beam current $I_D$ is a function of the deflected angle from the desired trajectory. Therefore, the conductive structures 225 could be used to measure the deflected angle of the deflected ion beam 201. In such situation, there are some conductive structures 225 separately located around the desired trajectory. Therefore, for different deflected angles, the deflected ion beam 201 may collide with different conductive structure(s) 225. After that, by continuously measuring different ion beam currents collected by different conductive structures 225, the deflection of the ion beam 201 could be real-time monitored. Without doubt, the more conductive structures 225 are used, the more precise the deflection of the ion beam 201 could be measured. Accordingly, the operation of the ion implanter 200 can be adjusted, even the ion implanter 200 can be maintained, such that the deflection of the ion beam 201 is improved. Besides, the real implantation on the wafer 202 also can be adjusted accordingly. For example, the wafer 202 may be tilted to adjust the real-time incident angle on the wafer 202, such that the ion beam 201 is dynamically vertically implanted as predetermined.

Furthermore, as shown on FIG. 4A, the ion beam 201 is projected from beam entrance 223 through beam exist 222 and then along a desired trajectory to wafer 202 in an ideal condition. Indeed, the deflected ion beam also passes through the beam exist 222. Therefore, the distribution of the conductive structures 225 can be divided into two cases: the distribution along a direction parallel to the desired trajectory, and the distribution on a cross-section of the beam exist vertical to the desired trajectory.

Figure 4B:
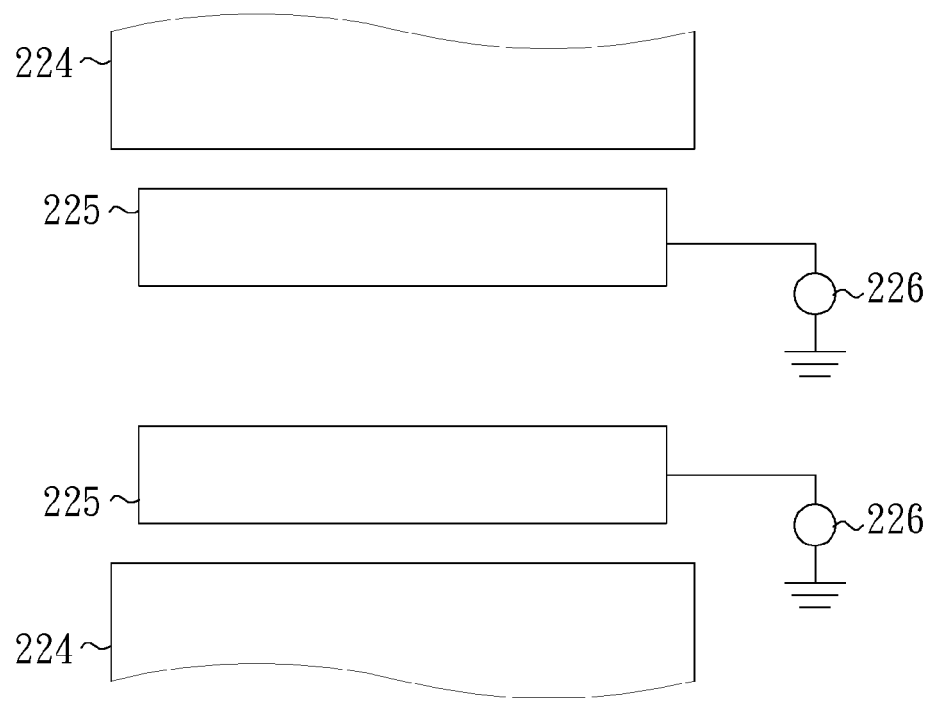
Figure 4C:
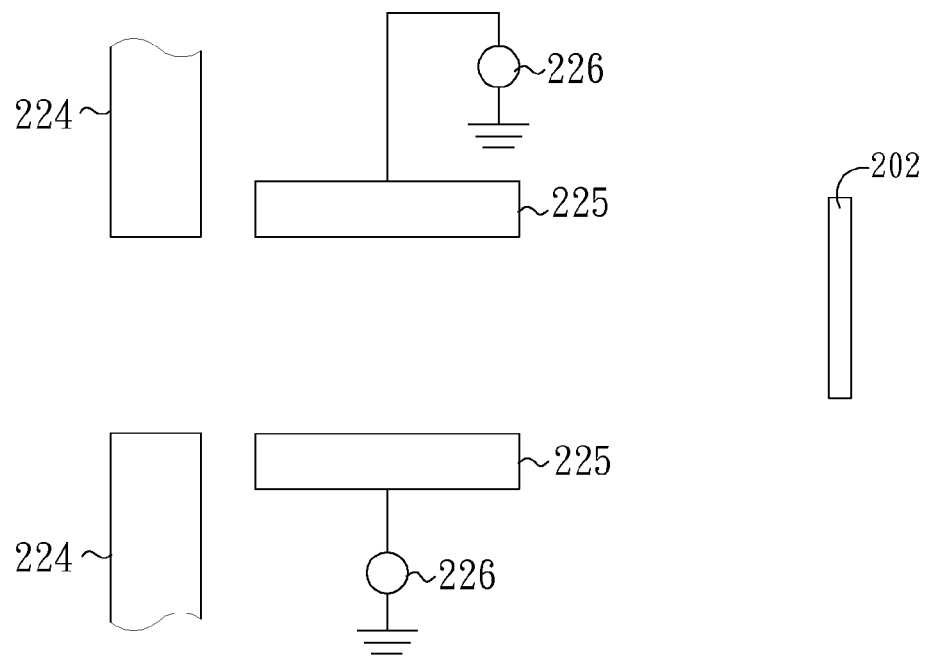
Figure 4D:
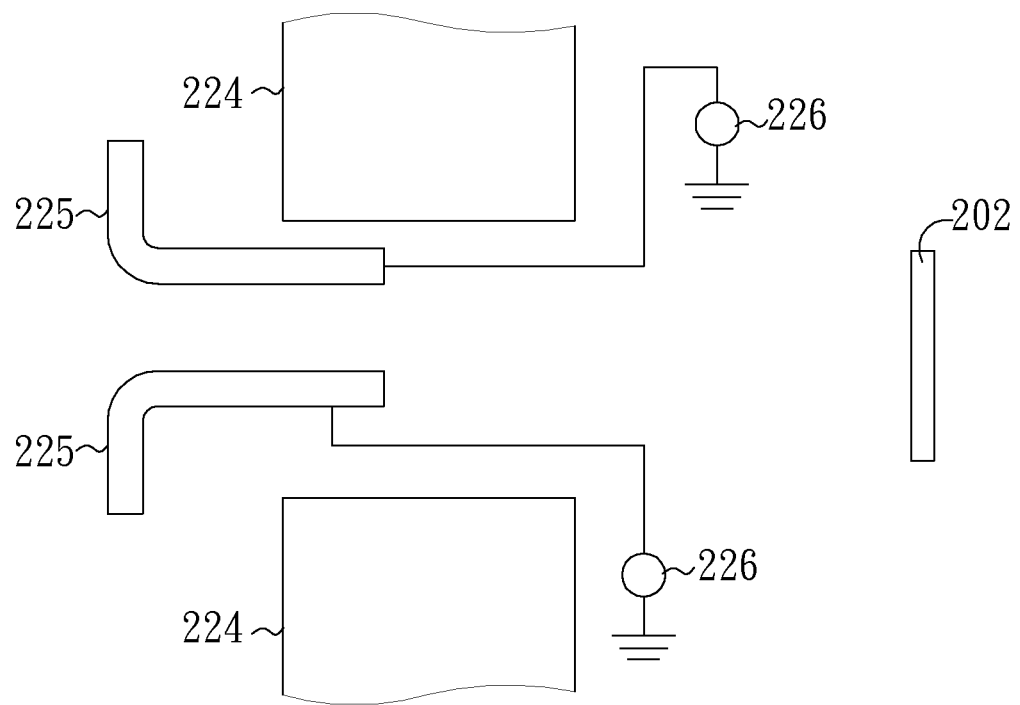

For example, some available variations of the first case are shown on FIG. 4B~4D. Herein, FIG. 4B shows that all conductive structures 225 are located only inside the beam exist 222. Herein, FIG. 4C shows that all conductive structures 225 are located outside the beam exist 222 and faced to the wafer 201. Herein, FIG. 4D shows that all conductive structures 225 are located around a portion of the shell 224. Note that the key is different deflected angles of deflected ion beam 201 can be defected by used conductive structure(s) 225.

Obviously, FIG. 4B shows a design capable of measuring a variable range of deflected angle (the larger the width of the conductive structure(s) 225 is, the larger the measureable deflected angle is FIG. 4C shows a design capable of measuring a variable range of deflected angle without reduction of the effective diameter of the beam exist 222 (the larger the width of the conductive structure is, the larger the measurable deflected angle is), and FIG. 4D shows a design capable of measuring a large range of deflected angle (the longer the length of the conductive structure 225 vertical to the desired trajectory is, the larger the measurable deflected angle is).

The variation shown on FIG. 4C could be amended to optional locate the conductive structures 225 outside the beam exist 222 and not overlapped with a cross-section of the beam exist 222. Herein, the cross-section is vertical to the desired trajectory. Clearly, in this amendment, no conductive structure 225 is added into the beam exist 222, and then it is easier to locate the conductive structure(s) 225.

The variation shown on FIG. 4D could be amended to optionally locate the conductive structures 225 located around a portion of the shell 224 is partially overlapped with both a cross-section of the beam exist 222 and a portion of the shell 224 adjacent to the beam exist 222. Herein, the cross-section is vertical to the desired trajectory. Clearly, in this amendment, the detectable defection angle can be simply increased by increasing the length of the conductive structures 225 overlapped with a portion of the shell 224.

Clearly, the key is the relative geometrical relation among the desired trajectory and the conductive structure(s) 225. By locating the conductive structure(s) 225 on different angle/distance relative to the desired trajectory, the different deflections of the ion beam 201 can be detected. As usual, owing to the ion beam 201 may be deflected to any direction, numerous conductive structures 225 usually are located around the desired trajectory.

Of course, there are other non-shown variations. For example, the conductive structure(s) 225 can be located as an array or numerous concentric loops around the desired trajectory. For example, because the conductive structure(s) 225 is used to the ion beam 201, the conductive structure(s) 225 can be at least one loop with a cross-sectional width briefly equal to a diameter of the ion beam, or some blocks separately distributed around the desired trajectory of the ion beam 201.

Note that the above variations only are example. The invention can mix any above variations and/or amend above variations. For example, the above "all conductive structures 225" limitation can be replaced by "at least one conductive structure 225". For example, the characteristics of above variations can be mixed in any example.

Notice that the invention never limits the detailed, location/shape/number of the conductive structure(s) 225. Indeed, even the material of the conductive structure(s) 225 also is not limited. The practical shape, location, number and material of the conductive structure(s) 225 could be changed case by case. For example, at least one conductive structure 225 can be made of non-metal conductive material attached to shell 224. For example, the available conductive material for forming at least one conductive structure 225 can be graphite, conductive film, conductive glue, and so on.

For example, the shell 224 usually is made of conductive material(s), such that ions with undesired charger and/or undesired mass are absorbed after collision with shell 224. Therefore, it is possible that the conductive structure(s) 225 is a portion of the shell 224. Of course, in such situation, the portion of shell 224 for collecting undesired ions and the portion of shell 224 for collecting defected ion beam 201 must be electrically insulated, such that the current measured by the current meter 226 only is induced by the deflected ion beam 201.

In short, one main characteristic only is locating at least one conductive structure close to the boundary of the beam exist and electrically insulated from the shell, such that at least portion of the deflected ion beam 201 could be detected before the deflected ion beam 201 is projected on the wafer 202.

Another embodiment of the present invention is a method for real-time monitoring an ion beam. Referring to FIG. 5, the method comprising the following steps: First, as shown on block 501, providing an ion beam that passes along a desired trajectory from a beam exist of an analyzer magnet of an ion implanter to a wafer in an ideal condition; Second, as shown on block 502, measure a current appears on at least one conductive structure located close to the beam exist, wherein each conductive structure is electrically insulated from other conductive structures and other portions of the analyzer magnet. Of course, each conductive structure is electrically coupled with a current meter for measuring the current.

Clearly, when the ion beam does not totally pass through the beam exist, some ions will collide with the conductive structure(s) and then induces an ion current on the conductive structure(s). Hence, by real-time separately monitor the ion current of each conductive structure(s), owing to the configuration, of the conductive structure(s) is known, the real trajectory of the ion beam could be real-time monitored.

Herein, the limitations and variations of the conductive structures is not the key of the embodiment. All limitations and variation discussed in above embodiments can be applied to the embodiment.

Moreover, after the real trajectory of the ion beam is real-time monitored, the real implantation result on the wafer also can be real-time monitored. Therefore, it is possible to adjust at least one practical parameter value of ion implanter, or implantation process, such that a real trajectory of the ion beam is adjusted to be the desired trajectory. For example, the practical parameter value of ion implanter are source condition (arc current/voltage, source magnet, process gas flow, filament current/voltage, cathode current/voltage), extraction manipulator position, extraction current/voltage, suppress in current/voltage, analyzer magnet unit (AMU) current/voltage, beam line pressure, and other deceleration/acceleration voltage/current during in the acceleration/deceleration region, faraday beam current, beam profiler. It also is possible to maintain the ion implanter, such that a real trajectory of the ion beam is adjusted to be the desired trajectory. Of course, if the cost/difficulty to adjust the real trajectory is high, it also is possible to adjust the geometric condition of the wafer, such that an implantation result of the ion beam along a real trajectory is equal to an implantation result of the ion beam along the desired trajectory.

Another embodiment of the present invention is a method for real-time monitoring an ion beam. The method of monitoring ion beam comprises: turning on an ion implanter 200 having a measurement device 228 positioned close to a special portion of a pre-determined ion beam path of said ion beam 201 and measuring a measured ion beam current received by said measurement device 228; wherein said measurement device 228 is positioned downstream an ion source 210 and upstream a wafer holder, said measurement device 228 has one or more conductive structures 225 close to said special portion but separated from both said special portion and other said conductive structures 225 and different said conductive structures 225 are electrically connected to different current meter 226 and measurement device 228 surrounds at least one of the following: said special portion and a straight line extending from said special position.

Similarly, the method also comprises sending a warning signal when measured ion beam current is not zero or the measured ion beam current is varied. The operation of the ion implanter 200 also can be adjust to adjust a practical ion beam path, an ion beam energy of the ion beam and an ion beam current of the ion beam according to the measured ion beam current, which includes. Furthermore, the ion implanter 200 can adjust a practical ion beam path when the measured ion beam current (which corresponds to the second ion beam current as mentioned above) is not zero so that the implantation over a wafer is adjusted correspondingly, wherein the measurement device 228 is separated from the ion beam 201 when the ion beam 201 is delivered along the pre-determined ion beam path under an ideal condition. The practical ion beam path is equal to the pre-determined ion beam path after adjusting said ion implanter 200, The method further comprises adjusting the ion implanter 200 so that the practical implant angle between the ion beam 201 and the wafer 202 is equal to a pre-determined implant angle when the ion beam 201 is not delivered along the pre-determined ion beam path.

As mentioned above, the special portion of the measurement device 228 is chosen from a group consisting of the following: the entrance of a mass analyzer, the exit of a mass analyzer, the terminal of the set of acceleration/deceleration electrode 231, the terminal of the set of deformation magnets 232, the terminal of the scanner for scanning said ion beam 201, the terminal of the plasma flow gun 233, and a position where said pre-determined ion beam path is bended.

The method also can decide the deflection direction and the deflection degree of the ion beam 201 according to different ion beam currents measured by different the conductive structures 225, wherein the relative position between each the conductive structure 225 and the special portion is controlled. The method can adjust the operation of the ion implanter 200 according to the deflection direction and the deflection degree of the ion beam 201. The method can adjust the relative movement between the ion beam 201 and the wafer holder according to the deflection direction and the deflection degree of said ion beam 201. Furthermore, the method can change the relative position between measurement device 228 and the special portion for further monitoring the deflection direction and the deflection degree of the ion beam. Besides, the method can move the measurement device 228 along the pre-determined ion beam path for monitoring a plurality of portions of the pre-determined ion beam path.

In summary, the ion beam may be real-time monitored even the Faraday cup is totally or at least partially blocked by the wafer or other hardware. Further, by comparing the different ion beam currents detected by the Friday cup and the measurement device, and/or by properly adjusting the details of the measurement device, the deflection of the ion beam may be precisely real-time monitored. Therefore, the operation, of the ion implanter, the practical ion beam, the relative movement between the wafer and the ion beam, the relative movement between the wafer holder and the ion beam, the relative position between the measurement device and the special portion can be adjusted accordingly. Hence, the deflection of the ion beam can be eliminated, the practical implantation over the wafer can be adjusted and the practical implantation angle can be adjusted by the method of monitoring ion beam of the present invention even the Faraday cup is blocked, at least partially blocked.

Although specific embodiments have been illustrated and described, it will be appreciated by those skilled in the art that various modifications may be made without departing from the scope of the present invention, which is intended to be limited solely by the appended claims.

What is claimed is:

1. A method of monitoring ion beam, comprising:
   turning on an ion implanter which has an analyzer magnet for filtering an ion beam, a wafer holder for moving a wafer, a Faraday cup for measuring the ion beam and a measurement device positioned close to a special portion of a pre-determined ion beam path of said ion beam; and
   measuring a first ion beam current received by said Faraday cup and a second ion beam current received by said measurement device;
   wherein said Faraday cup is positioned downstream said wafer holder;
   wherein said special portion is positioned downstream said analyzer magnet and upstream said wafer holder;

wherein said measurement device has one or more conductive structures, wherein each said conductive structure is separated from said special portion and other said conductive structures, and wherein different said conductive structures are electrically connected to different current meters.

2. The method as set forth in claim 1, further comprising sending a warning signal when at least one of the following is happened:
   said second ion beam current is not zero when said Faraday cup is totally blocked from said ion beam; and
   said second ion beam current is varied when said Faraday cup is totally blocked from said ion beam.

3. The method as set forth in claim 1, further comprising adjusting the operation of said ion implanter for adjusting at least one of following according to said first ion beam current and said second ion beam current: a practical ion beam path, an ion beam energy of said ion beam and a net ion beam current of said ion beam.

4. The method as set forth in claim 1, further comprising adjusting said ion implanter for adjusting a practical ion beam path when said second ion beam current is not zero so that the implantation over said wafer is adjusted correspondingly, wherein said measurement device is separated from said ion beam when said ion beam is delivered along said pre-determined ion beam path under an ideal condition.

5. The method as set forth in claim 4, further comprising adjusting said ion implanter so that said practical ion beam path is equal to said pre-determined ion beam path.

6. The method as set forth in claim 4, further comprising adjusting said wafer holder so that the practical implant angle between said ion beam and said wafer is equal to a pre-determined implant angle when said ion beam is not delivered along said pre-determined ion beam path.

7. The method as set forth in claim 1, further comprising adjusting at least one of the following according to said first ion beam current and said second ion beam current: said ion beam, the operation of said ion implanter and the relative movement between said wafer and said ion beam.

8. The method as set forth in claim 1, wherein said special portion is chosen from a group consisting of the following: the terminal of acceleration/deceleration electrode, the terminal of deformation magnets, the terminal of the scanner for scanning said ion beam, the terminal of the plasma flow gun, the internal space between neighboring acceleration/deceleration electrode, the internal space between the neighboring deformation magnets, and a position where said pre-determined ion beam path is bent.

9. The method as set forth in claim 1, further comprising deciding the deflection direction and the deflection degree of said ion beam according to different ion beam currents measured by different said conductive structures, wherein the relative position between each said conductive structure and said special portion is controlled.

10. The method as set forth in claim 9, further comprising adjusting the operation of said ion implanter according to the deflection direction and the deflection degree of said ion beam.

11. The method as set forth in claim 9, further comprising adjusting the relative movement between said ion beam and said wafer holder according to the deflection direction and the deflection degree of said ion beam.

12. The method as set forth in claim 9, further comprising changing the relative position between said measurement device and said special portion for further monitoring the deflection direction and the deflection degree of said ion beam.

13. The method as set forth in claim 1, wherein said measurement device surrounds at least one of the following: said special portion and a straight line extending from said special position.

14. The method as set forth in claim 1, further comprising moving said measurement device along said pre-determined ion beam path for monitoring a plurality of portions of said pre-determined ion beam path.

15. A method of monitoring ion beam, comprising:
   turning on an ion implanter having a measurement device positioned close to a special portion of a pre-determined ion beam path of an ion beam; and
   measuring a measured ion beam current received by said measurement device;
   wherein said special portion is positioned downstream an analyzer magnet for filtering said ion beam and upstream a wafer holder for moving a wafer to be implanted by said ion beam;
   wherein said measurement device has one or more conductive structures that each is positioned close to said special portion but separated from both said special portion and other said conductive structures, and wherein different said conductive structures are electrically connected to different current meters; and
   wherein said measurement device surrounds at least one of the following: said special portion and a straight line extending from said special position.

16. The method as set forth in claim 15, further comprising sending a warning signal when at least one of the following is happened:
   said measured ion beam current is not zero; and
   said measured ion beam current is varied.

17. The method as set forth in claim 15, further comprising adjusting the operation of said ion implanter for adjusting at least one of following according to said measured ion beam current: a practical ion beam path, an ion beam energy of said ion beam and an ion beam current of said ion beam.

18. The method as set forth in claim 15, further comprising adjusting said ion implanter for adjusting a practical ion beam path when said measured ion beam current is not zero so that the implantation over a wafer is adjusted correspondingly.

19. The method as set forth in claim 18, further comprising adjusting said ion implanter so that said practical ion beam path is equal to said pre-determined ion beam path.

20. The method as set forth in claim 18, further comprising adjusting said ion implanter so that the practical implant angle between said ion beam and said wafer is equal to a pre-determined implant angle when said ion beam is not delivered along said pre-determined ion beam path.

21. The method as set forth in claim 15, wherein said special portion is chosen from a group consisting of the following: the terminal of acceleration/deceleration electrode, the terminal of deformation magnets, the terminal of the scanner for scanning said ion beam, the terminal of the plasma flow gun, the internal space between neighboring acceleration/deceleration electrode, the internal space between the neighboring deformation magnets, and a position where said pre-determined ion beam path is bent.

22. The method as set forth in claim 15, further comprising deciding the deflection direction and the deflection degree of said ion beam according to different ion beam currents measured by different said conductive structures, wherein the relative position between each said conductive structure and said special portion is controlled.

23. The method as set forth in claim 22, further comprising adjusting the operation of said ion implanter according to the deflection direction and the deflection degree of said ion beam.

24. The method as set forth in claim 22, further comprising adjusting the relative movement between said ion beam and said wafer holder according to the deflection direction and the deflection degree of said ion beam.

25. The method as set forth in claim 22, further comprising changing the relative position between said measurement device and said special portion for further monitoring the deflection direction and the deflection degree of said ion beam.

26. The method as set forth in claim 15, further comprising moving said measurement device along said pre-determined ion beam path for monitoring a plurality of portions of said pre-determined ion beam path.

27. An ion implanter, comprising:
an ion source for providing an ion beam;
a wafer holder for holding a wafer to be implanted by said ion beam;
an analyzer magnet for filtering an ion beam;
a Faraday cup for measuring said ion beam when said ion beam is not implanted into said wafer; and
a measurement device which is positioned close to a special portion of a pre-determined ion beam path of said ion beam;
wherein said Faraday cup is positioned downstream said wafer holder;
wherein said special portion is positioned downstream said analyzer magnet and upstream said wafer holder; and
wherein said measurement device has one or more conductive structures closed to said special portion, wherein each said conductive structure is separated from said special portion and other said conductive structures, and wherein different said conductive structures are respectively electrically connected to different current meters.

28. The ion implanter as set forth in claim 27, wherein said special portion is chosen from a group consisting of the following: the terminal of acceleration/deceleration electrode, the terminal of deformation magnets, the terminal of a scanner for scanning said ion beam, the terminal of a plasma flow gun, the internal space between neighboring acceleration/deceleration electrode, the internal space between the neighboring deformation magnets, and a position where said pre-determined ion beam path is bent.

29. The ion implanter as set forth in claim 27, wherein said measurement device surrounds at least one of the following: said special portion and a straight line extending from said special position.

* * * * *